United States Patent
Park et al.

(10) Patent No.: US 10,208,401 B2
(45) Date of Patent: Feb. 19, 2019

(54) SUBSTRATE TREATING APPARATUS

(71) Applicant: Samsung Electronics Co., Ltd., Suwon-si (KR)

(72) Inventors: Keum Seok Park, Seoul (KR); Sunjung Kim, Suwon-si (KR); Yihwan Kim, Seongnam-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/664,294

(22) Filed: Jul. 31, 2017

(65) Prior Publication Data

US 2018/0266017 A1    Sep. 20, 2018

(30) Foreign Application Priority Data

Mar. 16, 2017 (KR) .................. 10-2017-0033293

(51) Int. Cl.
| | | |
|---|---|---|
| *C30B 25/04* | (2006.01) | |
| *C30B 33/12* | (2006.01) | |
| *C30B 25/12* | (2006.01) | |
| *C30B 25/14* | (2006.01) | |
| *C30B 31/16* | (2006.01) | |

(Continued)

(52) U.S. Cl.
CPC .............. *C30B 33/12* (2013.01); *C30B 25/12* (2013.01); *C30B 25/14* (2013.01); *C30B 31/14* (2013.01); *C30B 31/16* (2013.01); *H01L 21/02057* (2013.01); *H01L 21/0257* (2013.01); *H01L 21/0262* (2013.01); *H01L 21/02532* (2013.01); *H01L 29/66545* (2013.01); *H01L 29/66636* (2013.01)

(58) Field of Classification Search
CPC .......... C30B 21/02; C30B 23/02; C30B 25/04
See application file for complete search history.

(56) References Cited

U.S. PATENT DOCUMENTS 6,180,541 B1 * 1/2001 Joo ................... C23C 16/4481
257/E21.272
9,245,767 B2  1/2016 Francischetti et al.
(Continued)

FOREIGN PATENT DOCUMENTS

KR  10-2013-0048439 A    5/2013
KR  10-2013-0136981 A   12/2013
(Continued)

*Primary Examiner* — Robert M Kunemund
(74) *Attorney, Agent, or Firm* — Muir Patent Law, PLLC

(57) ABSTRACT

Disclosed is a substrate treating apparatus comprising a wafer chuck on which a substrate is placed, an injector unit on a side of the wafer chuck and injecting process gases that include a first gas and a second gas, and a gas supply unit supplying the process gases to the injector unit. The gas supply unit comprises first and second gas supply sources that respectively accommodate the first and second gases, first and second gas supply lines that respectively connect the first and second gas supply sources to the injector unit, and first and second heating units that are respectively disposed on the first and second gas supply lines. The first heating units disposed on the first gas supply line have a density per unit length greater than the density per unit length of the second heating units disposed on the second gas supply line.

19 Claims, 9 Drawing Sheets

(51) Int. Cl.
*C30B 31/14* (2006.01)
*H01L 21/02* (2006.01)
*H01L 29/66* (2006.01)

(56) References Cited

U.S. PATENT DOCUMENTS

| | | | |
|---|---|---|---|
| 2001/0019752 A1* | 9/2001 | Purdy | C04B 35/83 |
| | | | 428/64.1 |
| 2010/0215872 A1 | 8/2010 | Sivaramakrishnan et al. | |
| 2012/0064698 A1 | 3/2012 | Olgado | |
| 2015/0013594 A1 | 1/2015 | Yamada et al. | |
| 2016/0032488 A1 | 2/2016 | Takahashi et al. | |

FOREIGN PATENT DOCUMENTS

| KR | 10-1528055 B1 | 6/2015 |
|---|---|---|
| KR | 10-2015-0081536 A | 7/2015 |
| KR | 10-2016-0016678 A | 2/2016 |
| KR | 10-1640918 B1 | 7/2016 |
| KR | 10-1655261 B1 | 9/2016 |

\* cited by examiner

SUBSTRATE TREATING APPARATUS

CROSS-REFERENCE TO RELATED APPLICATIONS

This U.S. nonprovisional patent application claims the benefit of priority under 35 U.S.C § 119 to Korean Patent Application No. 10-2017-0033293 filed on Mar. 16, 2017, the entire contents of which are hereby incorporated by reference.

BACKGROUND

The present disclosure relates to a substrate treating apparatus, and more particularly, to a substrate treating apparatus in which a substrate is supplied with process gases to perform a selective epitaxial growth process.

As sizes and design rules of semiconductor devices are gradually decreased, it is desired to reduce thermal budget in fabricating the semiconductor devices. Accordingly, various researches have been developed to manufacture the semiconductor devices having superior performances while overcoming limitations due to high integration of the semiconductor devices.

SUMMARY

Embodiments of the present disclosure provide a substrate treating apparatus capable of selective temperature control based on process conditions and/or characteristics of process gases.

According to exemplary embodiments of the present disclosure, a substrate treating apparatus may comprise: a wafer chuck configured to receive a substrate; an injector unit disposed on a side of the wafer chuck, the injector unit is configured to inject process gases that include a first gas and a second gas; and a gas supply unit that supplies the process gases to the injector unit, wherein the gas supply unit comprises: a first gas supply source configured to accommodate the first gas and a second gas supply source configured to accommodate the second gas; a first gas supply line connecting the first gas supply source to the injector unit and a second gas supply line connecting the second gas supply source to the injector unit; and first heating units disposed on the first gas supply line and second heating units disposed on the second gas supply line, wherein the first heating units disposed on the first gas supply line have a first density per unit length of the first gas supply line and the second heating units disposed on the second gas supply line have a second density per unit length of the second gas supply line, and wherein the first density per unit length of the first gas supply line is greater than the second density per unit length of the second gas supply line.

According to exemplary embodiments of the present disclosure, a method of manufacturing a semiconductor device may comprise: placing a substrate on a top surface of a wafer chuck; supplying a source gas on the substrate from a source gas supply unit via a source gas supply line, the source gas supply line having a plurality of first heating units configured to heat the source gas, the plurality of first heating units having a first density per unit length of the source gas supply line; and supplying an etching gas on the substrate from an etching gas supply unit via an etching gas supply line, the etching gas supply line having a plurality of second heating units configured to heat the etching gas, the plurality of second heating units having a second density per unit length of the etching gas supply line, wherein the second density per unit length of the etching gas supply line is greater than the first density per unit length of the source gas supply line.

Details of other exemplary embodiments are included in the description and drawings.

DETAILED DESCRIPTION OF EMBODIMENTS

The present disclosure now will be described more fully hereinafter with reference to the accompanying drawings, in which various embodiments are shown. The invention may, however, be embodied in many different forms and should not be construed as limited to the example embodiments set forth herein. These example embodiments are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention.

It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

Figure 1:
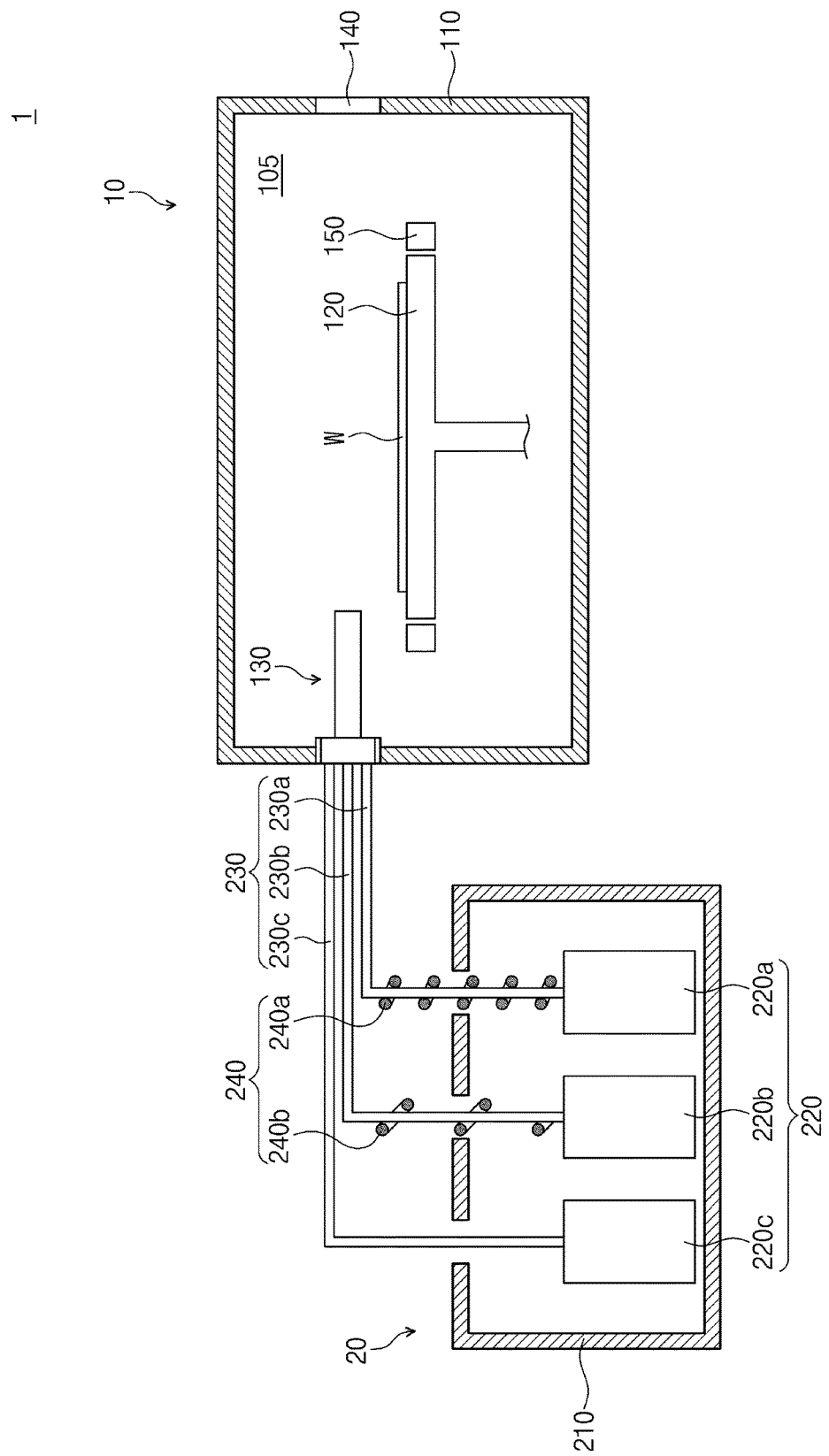
FIG. 1 is a schematic diagram roughly showing a substrate treating apparatus according to exemplary embodiments of the present disclosure.
Figure 2:
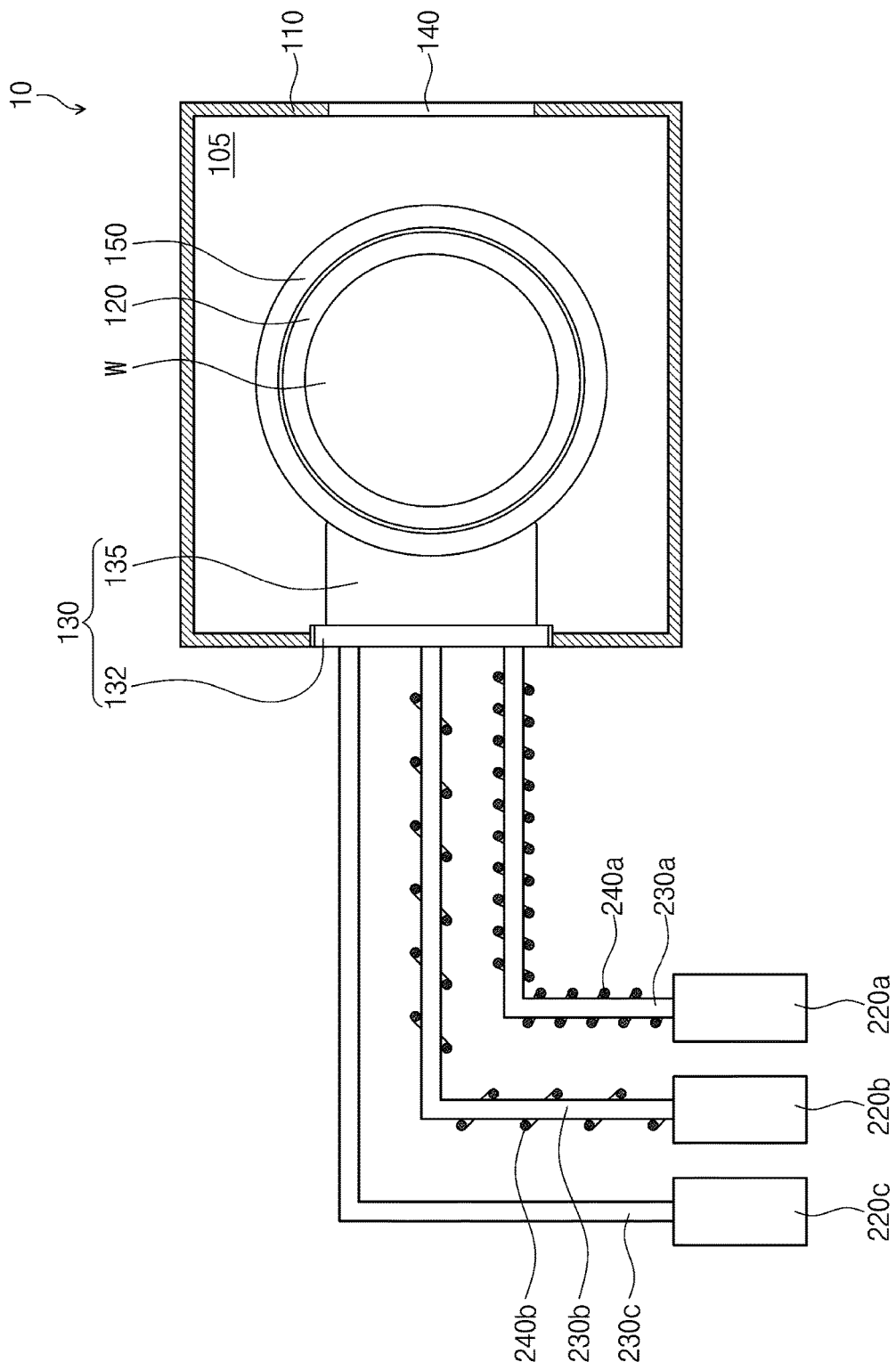
FIG. 2 is a schematic top view showing the substrate treating apparatus of FIG. 1.

FIG. 1 is a schematic diagram showing a substrate treating apparatus 1 according to exemplary embodiments of the present disclosure. FIG. 2 is a schematic top view showing the substrate treating apparatus 1 of FIG. 1. The substrate treating apparatus 1 may be configured to perform a process in which a deposition target, for example, a substrate including a wafer W is supplied with process gases. For example, the process may be, but not limited to, a selective epitaxial growth (SEG) process.

Referring to FIGS. 1 and 2, the substrate treating apparatus 1 may include a first apparatus 10 and a gas supply unit 20. The first apparatus 10 may perform the process on the wafer W, and the gas supply unit 20 may supply the first apparatus 10 with the process gases. The process gases may include first to third process gases.

The first apparatus 10 may include a process chamber 110, a susceptor 120, an injector unit 130, an exhaust unit 140, and a pre-heating ring 150.

The process chamber 110 may have an inner space 105 where the process is performed on a deposition target, for example, a substrate including a wafer W. The susceptor 120 may be disposed at a central portion of the process chamber 110. The susceptor 120 may be a semiconductor wafer chuck and configured to receive the wafer W. For example, the wafer W may be placed on the susceptor 120 during a deposition process. It will be appreciated that the substrate or the wafer W may be any one of the monolithic structures resulting from one of the many stages of a semiconductor manufacturing process (including intermediate stages and intermediate structures), and may comprise an initial substrate (e.g., semiconductor crystalline wafer) or a structure substantially the same as the final semiconductor device(s) formed within and/or on such an initial structure. When the process is performed on the wafer W, the process chamber 110 may be hermetically sealed.

The susceptor 120 may be installed within the process chamber 110. The wafer W may be placed on a top surface of the susceptor 120. The susceptor 120 may rotated and moved up and down by a drive (note shown). For example, the susceptor 120 may be rotated with a constant velocity. For example, the constant velocity may be a constant angular velocity.

The injector unit 130 may be engaged with the process chamber 110. The injector unit 130 may supply the process gases onto the wafer W (e.g., a wafer) placed on the susceptor 120. The injector unit 130 may include an injector 132 and an injector baffle 135. The injector 132 may be coupled to a sidewall of the process chamber 110. For example, in some embodiments, the injector 132 may be coupled to a first sidewall of the process chamber 110 and the exhaust unit 140 may be coupled to a second wall of the process chamber 110 opposite the first side wall of the process chamber 110. The injector baffle 135 may have an end portion connected to the injector 132 and another end portion extending adjacent to the susceptor 120. For example, in some embodiments, a first end portion of the injector baffle 135 is connected to the injector 132 which is coupled to the first wall of the process chamber 110 and a second end portion opposite the first end portion of the injector baffle 135 extends away from the first wall of the process chamber 110 in a direction horizontal to the top surface of the susceptor 120 such that the second end portion of the injector baffle 135 is further away from the first wall of the process chamber 110 compared to the first end portion of the injector baffle 135. The second end portion of the injector baffle 135 may have a shape corresponding to outer surfaces of the susceptor 120 and the pre-heating ring 150. Although the second end portion of the injector baffle 135 is illustrated to have an arc shape, the shape of the injector baffle 135 is not limited thereto. The injector 132 may include stainless steel, and the injector baffle 135 may include quartz or $SiO_2$. A detail configuration of the injector unit 130 will be explained below.

The exhaust unit 140 may be engaged with the process chamber 110. For example, the exhaust unit 140 may be coupled to another sidewall of the process chamber 110. The exhaust unit 140 may be disposed to face the injector unit 130. For example, the injector unit 130 may be coupled to a first side wall of the process chamber and the exhaust unit 140 may be coupled to a second wall of the process chamber 110 opposite the first side wall of the process chamber 110. When the process is terminated, the process gases may be exhausted through the exhaust unit 140 from an inside of the process chamber 110 to an outside thereof. Although not shown in figures, the exhaust unit 140 may include an exhaust port and/or a pump for easily exhausting the process gases.

The pre-heating ring 150 may be installed within the process chamber 110. The susceptor 120 may be surrounded at its outer perimeter by the pre-heating ring 150. The pre-heating ring 150 is exemplarily illustrated to have a circular ring, but the shape and structure of the pre-heating ring 150 are not limited to that shown in figures. The pre-heating ring 150 may pre-heat the process gases before the wafer W is provided thereon with the process gases supplied into the inner space 105 through the injector unit 130. The pre-heating of the process gases may establish a process environment. The pre-heating ring 150 may include graphite, and have a coating layer surrounding an outer surface thereof. The coating layer may include silicon carbide.

The gas supply unit 20 may include a chamber 210, a gas supply source 220, a gas supply line 230, and a heating unit system 240. The gas supply unit 20 may be disposed outside the process chamber 110. As shown in FIG. 1, the gas supply unit 20 may include the chamber 210 separately disposed outside the process chamber 110, but the present disclosure is not limited thereto.

The gas supply source 220 may be provided in plural. For example, the gas supply source 220 may include a first gas supply source 220a, a second gas supply source 220b, and a third gas supply source 220c. The gas supply line 230 may be provided in plural. For example, the gas supply line 230 may include a first gas supply line 230a, a second gas supply line 230b, and a third gas supply line 230c. The injector unit 130 may be connected through the first to third gas supply lines 230a to 230c to the first to third gas supply sources 220a to 220c, respectively. Although FIG. 1 shows that the injector unit 130 is coupled to the first to third gas supply lines 230a to 230c positioned at different heights, this configuration is merely an example for emphasizing that the first to third gas supply lines 230a to 230c are individually coupled to the injector unit 130. The present disclosure, however, is not limited thereto.

The heating unit system 240 may be disposed on the gas supply line 230. The heating unit system 240 includes at least one first heating unit 240a and at least one second heating unit 240b. One or more first heating units 240a may be disposed on the first gas supply line 230a, and one or more second heating units 240b may be disposed on the second gas supply line 230b. No heating line may be provided on the third gas supply line 230c. The heating units 240a, 240b of the heating unit system 240 may include various types of heaters including, but not limited to, a heating coil or a heating jacket.

According to exemplary embodiments of the present disclosure, the first gas supply line 230a may be provided thereon with the first heating units 240a. The first heating units 240a may have a first density per unit length of the first gas supply line 230a. The second gas supply line 230b may be provided thereon with the second heating units 240b. The second heating units 240b may have a second density per unit length of the second gas supply line 230b. In some embodiments, the first density per unit length of the first gas supply line 230a is greater than the second density per unit length of the second gas supply line 230b. The first heating units may provide a greater heat flux density, or greater heat rate per unit area to the first gas supply line, than the heat flux density (or heat rate per unit area) to the second gas supply line. For example, the maximum heat flux density provided by a contiguous group of first heating units 240a to the first gas supply line 230a may be greater than the maximum heat flux density that may be provided by a contiguous group of second heating units 240b to the second gas supply line 230b. The first and second heating units 240a and 240b may be of the same type heater. According to some exemplary embodiments, the third gas supply line 230c may not be provided thereon with any heating units.

In this description, the term "density of unit length" of the heating unit may mean a density of the heating units disposed on a unit length of the gas supply line. The higher the density of unit length of the heating unit, the more heat that may be provided to the process gas flowing through the gas supply line by the heating unit. For example, according to exemplary embodiments, since the first heating units 240a provided on the first gas supply line 230a has a greater density per unit length than that of the second heating units 240b provided on the second gas supply line 230b, more heat (e.g., watts per unit area) may be provided to the process gas flowing through the first gas supply line 230a compared to the heat (e.g., watts per unit area) that may be provided to the process gas flowing through the second gas supply line 230b. Even when the gas supply lines have different lengths from each other depending on their structures and/or arrangement, it may be possible to compare heat provided to the process gases by examining densities of unit lengths of the heating units.

For example, a first process gas supplied through the first gas supply line 230a may be controlled to have a temperature greater than the temperature of a second process gas supplied through the second gas supply line 230b, and the temperature of the second process gas may be controlled to have a temperature greater than the temperature of a third process gas supplied through the third gas supply line 230c. When the first and second heating units 240a and 240b are different types of heaters, the first heating unit 240a may be configured to have a heating amount greater than the heating amount of the second heating unit 240b. For example, when the first and second heating units 240a and 240b are different types of heaters (e.g., the first heating units 240a are heating coil and the second heating units 240b are heating jackets) but have the same density of unit length, the first heating unit 240a may be configured to have a heating amount greater than the heating amount of the second heating unit 240b so that a first process gas supplied through the first gas supply line 230a may have a temperature greater than the temperature of a second process gas supplied through the second gas supply line 230b.

The first gas supply source 220a may accommodate the first process gas. The first process gas may be an etching gas. For example, the first process gas may include HCl. Alternatively, the first process gas may be a chlorine-containing gas such as a chlorine gas. Although not shown in figures, the first gas supply source 220a may be provided in plural. That is, first gas supply source 220a may comprise several discrete sources of first gas(es) such as those described herein.

Figure 3:
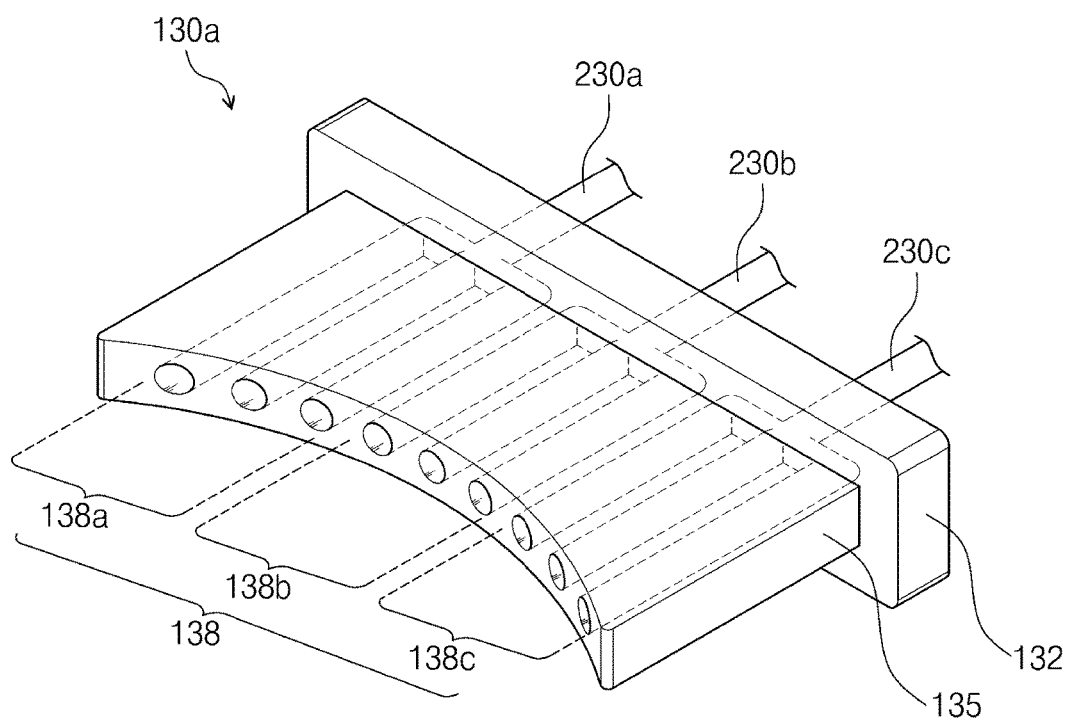
FIG. 3 is a schematic perspective view showing an injector unit according to exemplary embodiments of the present disclosure.

The second gas supply source 220b may accommodate the second process gas. The second process gas may be a source gas. For example, the second process gas may be a silicon source gas such as $SiH_4$. Alternatively, the second process gas may be a silicon source gas such as $Si_2H_6$ or a germanium source gas such as $GeH_4$. Although not shown in figures, the second gas supply source 220b may be provided in plural. That is, second gas supply source 220b may comprise several discrete sources of second gas(es) such as those described herein The third gas supply source 220c may accommodate the third process gas. The third process gas may be a dopant gas. For example, the third process gas may include $B_2H_6$. Alternatively, the third process gas may include $BCl_3$, $PH_3$, $AsH_3$, or the like. Although not shown in figures, the third gas supply source 220c may be provided in plural. That is, third gas supply source 220c may comprise several discrete sources of third gas(es) such as those described herein FIG. 3 is a schematic perspective view showing an injector unit 130a according to exemplary embodiments of the present disclosure. As discussed above, the injector unit 130a may include the injector 132 and the injector baffle 135.

The injector baffle 135 may include spray holes 138. The spray holes 138 may include a first spray hole 138a, a second spray hole 138b, and a third spray hole 138c. Each of the first to third spray holes 138a to 138c may be provided in plural. FIG. 3 exemplarily shows that each of the first to third spray holes 138a to 138c has three spray holes, but the present inventive concept is not limited thereto.

The first spray holes 138a may be connected to the first gas supply line 230a such that the first process gas may be supplied through the first spray holes 138a from the first gas supply line 230a. The second spray holes 138b may be connected to the second gas supply line 230b such that the second process gas may be supplied through the second spray holes 138b from the second gas supply line 230b. The third spray holes 138c may be connected to the third gas supply line 230c such that the third process gas may be supplied through the third spray holes 138c from the third gas supply line 230c.

Even when the first to third process gases are supplied respectively through the first to third spray holes 138a to 138c to individual regions of the wafer W, the susceptor 120 may rotate the wafer W to cause the first to third process gases to be supplied onto the entire exposed upper surface of the wafer W.

Figure 4:
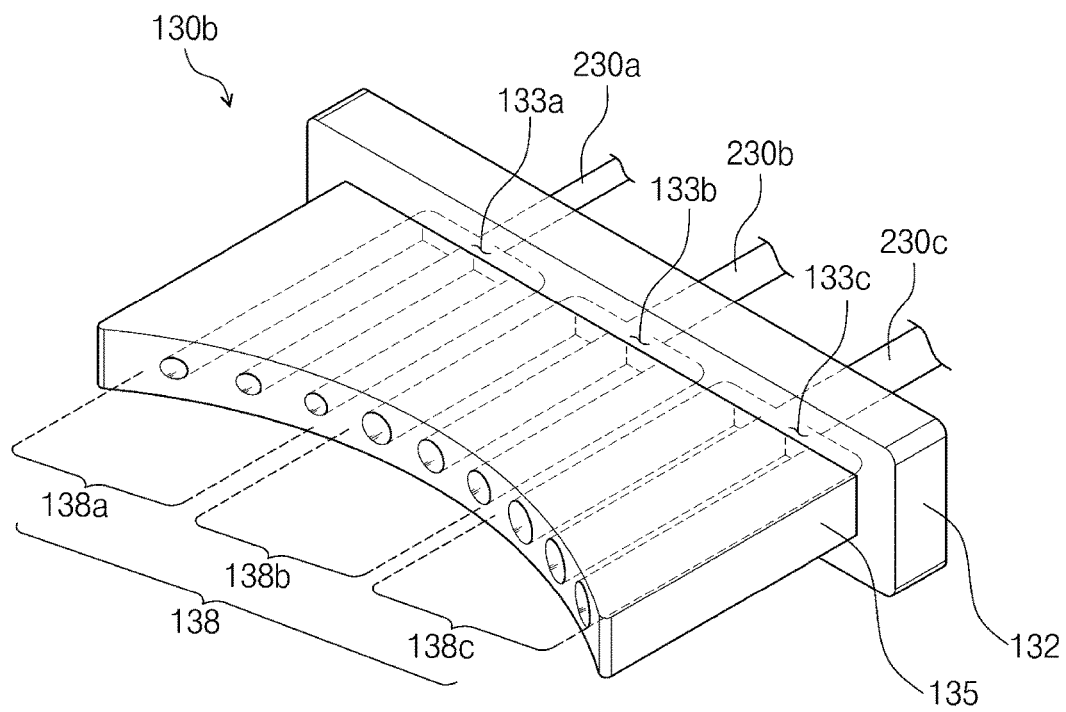
FIG. 4 is a schematic perspective view showing an injector unit according to exemplary embodiments of the present disclosure.

FIG. 4 is a schematic perspective view showing an injector unit 130b according to exemplary embodiments of the present disclosure. In one exemplary embodiment that follows, component substantially the same as those of the injector unit 130a discussed with reference to FIG. 3 are allocated the same reference numerals thereto, and repetitive explanations thereof may be omitted in the interest of brevity of the description.

The first spray hole 138a may have a cross-sectional area smaller than the cross-sectional area of the second spray hole 138b, and the cross-sectional area of the second spray hole 138b may be smaller than the cross-sectional area of the third spray hole 138c. As discussed above, since the first process gas is controlled to have a temperature greater than the temperature of the second process gas, and the temperature of the second process gas is controlled to have a temperature greater than the temperature of the third process gas, the first process gas may have a diffusion rate smaller than the diffusion rate of the second process gas, and the diffusion rate of the second process gas may be smaller than the diffusion rate of the third process gas.

The injector unit 130b may control the first to third process gases to have different supply amounts passing through the different cross-sectional areas of the first to third spray holes 138a to 138c, and thereby the first to third process gases may be uniformly supplied to the wafer W.

Figure 5:
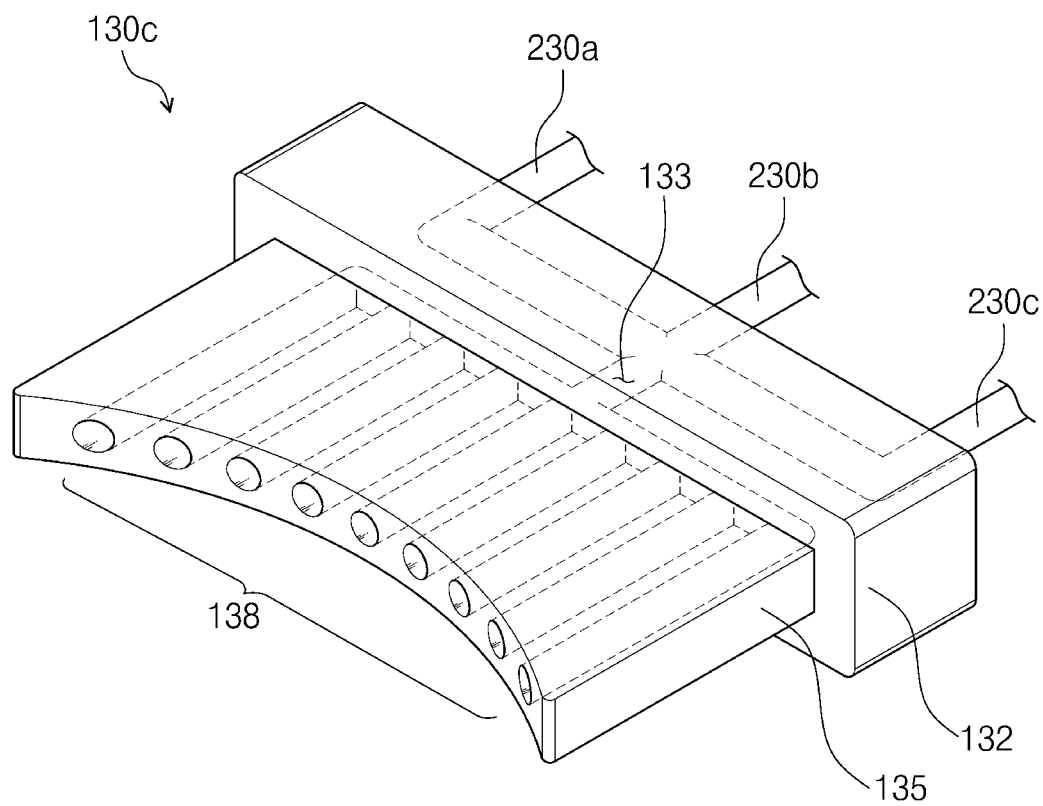
FIG. 5 is a schematic perspective view showing an injector unit according to exemplary embodiments of the present disclosure.

FIG. 5 is a schematic perspective view showing an injector unit 130c according to exemplary embodiments of the present disclosure. In one exemplary embodiment that follows, component substantially the same as those of the injector unit 130a discussed with reference to FIG. 3 are allocated the same reference numerals thereto, and repetitive explanations thereof may be omitted in the interest of brevity of the description.

The injector unit 130c may further include a mixing zone 133 disposed therein. The mixing zone 133 may have an end spatially connected to the first to third gas supply lines 230a to 230c and another end spatially connected to the spray holes 138. The first to third process gases may be mixed with each other in the mixing zone 133, and the wafer W may be supplied with a mixture of the process gases supplied through the spray holes 138. The mixture of the process gases may be uniformly supplied onto an overall region of the wafer W. Plural such mixing zones 133 may be implemented, such as one mixing zone for each of first to third spray holes 138a to 138c for the embodiment of FIG. 3 or for the embodiment of FIG. 4. Thus, several first process gases, such as several etchant gases or several gases used in an etching process may be mixed together by a first mixing zone 133a to be supplied to the process chamber 110 via first spray holes 138a, several second process gases, such as several source gases used to form and deposit a material layer on wafer W may be mixed together by a second mixing zone 133b to be supplied to the process chamber 110 via second spray holes 138b and several third process gases, such as several dopant gases, may be mixed together by a third mixing zone 133c to be supplied to the process chamber 110 via third spray holes 138c. In other examples, the first mixing zone 133a may be used to mix first process gases used for etching while the second mixing zone 133b may be used to mix second and third process gases to mix source gases and dopant gases that are precursors to the material and dopant within the material that is formed on the wafer W.

Figure 6:
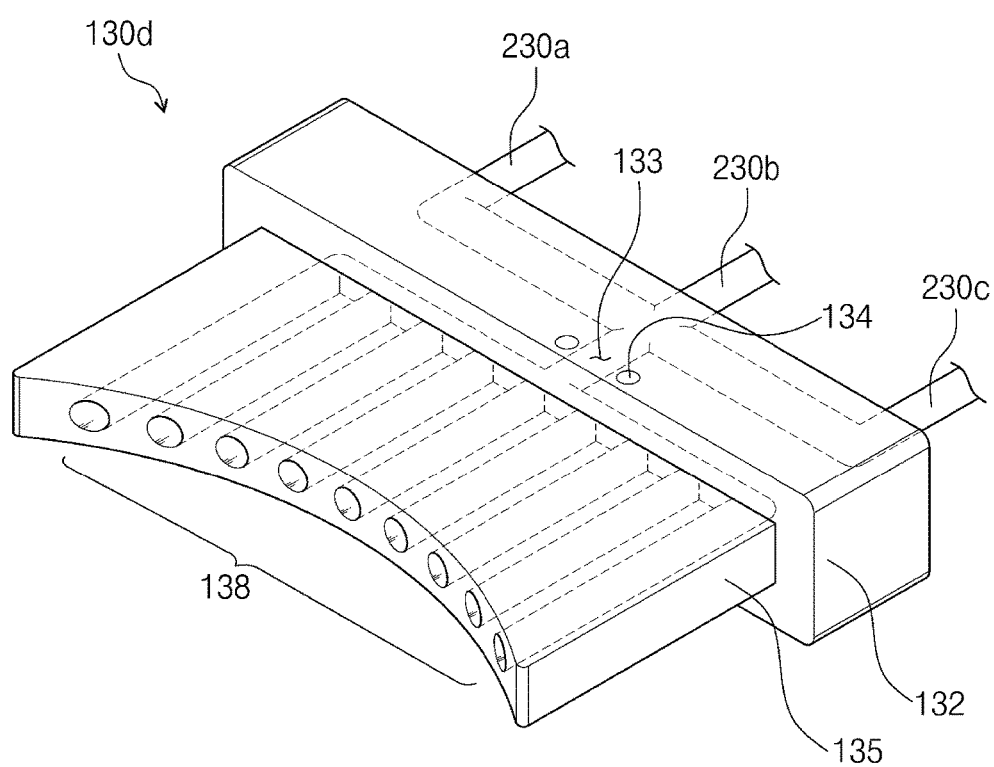
FIG. 6 is a schematic perspective view showing an injector unit according to exemplary embodiments of the present disclosure.

FIG. 6 is a schematic perspective view showing an injector unit 130d according to exemplary embodiments of the present disclosure. In one exemplary embodiment that follows, component substantially the same as those of the injector unit 130c discussed with reference to FIG. 5 are allocated the same reference numerals thereto, and repetitive explanations thereof may be omitted in the interest of brevity of the description.

The injector unit 130d may further include therein a third heating unit 134 disposed to surround the mixing zone 133. The third heating unit 134 may be provided as a heating coil or a heating jacket. The third heating unit 134 may be provided to surround the mixing zone 133, and may thus modulate setting temperatures of the process gases.

According to exemplary embodiments of the present disclosure, there may be provided a substrate treating apparatus capable of selective temperature control based on process conditions and/or characteristics of the process gases. For example, on the basis of a desired process object (e.g., achievement of high selectivity or high unit per equipment hour (UPEH)), the process gases may be selected and adjusted in their temperature. For example, the substrate treating apparatus discussed above may be constructed in such a way that an etching gas may be controlled to have a relatively high temperature in order to achieve high selectivity and a silicon source gas may be controlled to have a relatively high temperature in order to achieve high UPEH.

FIGS. 7A through 7E are schematic cross-sectional views showing a method of manufacturing a semiconductor device using the substrate treating apparatus 1 according to exemplary embodiments of the present disclosure. The substrate treating apparatus 1 may include any one of the injector units 130a to 130d mentioned above. As used herein, a semiconductor device may refer to a device such as a semiconductor chip (e.g., memory chip and/or logic chip formed on a die).

Hereinafter, a method of manufacturing a semiconductor device will be described using the substrate treating apparatus 1 according to exemplary embodiments of the present disclosure. FIGS. 7A through 7E exemplarily illustrate a planar type transistor as the semiconductor device, or alternatively a Fin-FET (Fin Field Effect Transistor) may be adopted as the semiconductor device.

Figure 7A:
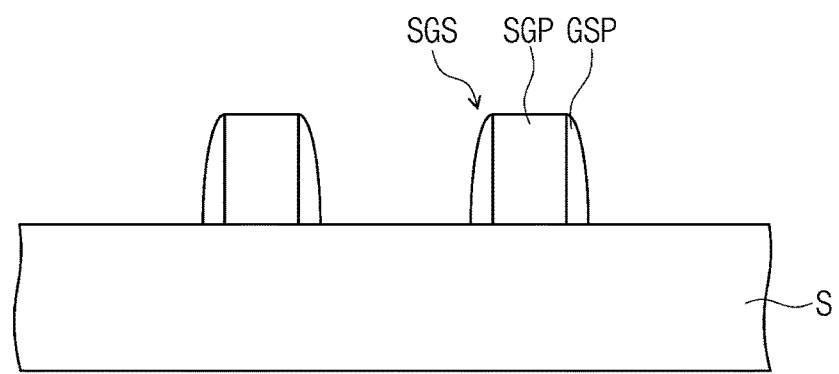
FIGS. 7A through 7E are schematic cross-sectional views showing a method of manufacturing a semiconductor device using a substrate treating apparatus according to exemplary embodiments of the present disclosure.

Referring to FIG. 7A, a substrate S may be provided thereon with sacrificial gate structures SGS. The sacrificial gate structures SGS may include sacrificial gate patterns SGP. The sacrificial gate patterns SGP may include polysilicon. The sacrificial gate patterns SGP may each have sidewalls on which gate spacers GSP are disposed. Although not shown in figures, each of the sacrificial gate structures SGS may further include an etch stop pattern.

Figure 7B:
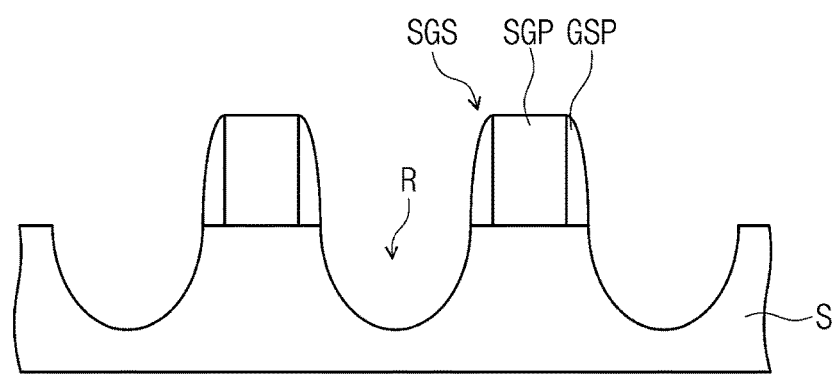

Referring to FIG. 7B, a recession R may be formed by recessing the substrate S exposed on both sidewalls of each of the sacrificial gate structures SGS. A dry or wet etching process may be performed to recess the substrate S.

Figure 7C:
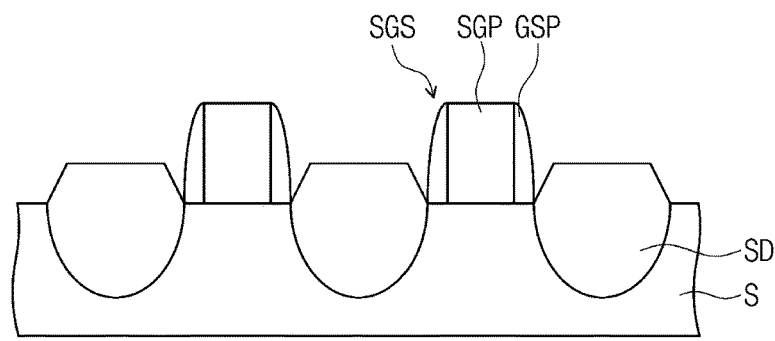

Referring to FIG. 7C, source/drain regions SD may be formed on both sides of the sacrificial gate structure SGS. The formation of the source/drain regions SD may include performing a selective epitaxial growth process on the substrate S. The source/drain regions SD may be epitaxial patterns grown from the substrate S used as a seed. A source gas may be supplied through the second gas supply line 230b from the second gas supply source 220b. In this step, according to exemplary embodiments, the second gas supply source 220b may be provided in plural, and thus a silicon source gas and a germanium source gas may be supplied together.

The source/drain regions SD may be doped with impurities either simultaneously with or after the epitaxial growth process. Although not shown in figures, the source/drain regions SD may include a plurality of epitaxial patterns. A dopant gas may be supplied through the third gas supply line 230c from the third gas supply source 220c.

Figure 7D:
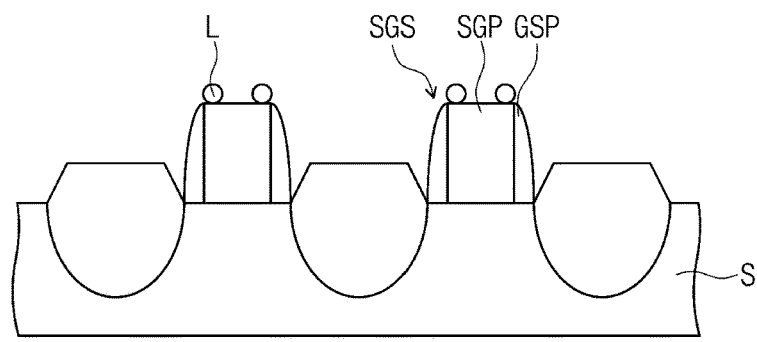

Referring to FIG. 7D, when the source/drain regions SD are formed, a residue L may remain on the sacrificial gate structure SGS. For example, the residue L may be formed by reaction between the sacrificial gate structure SGS and one or more of the source gases and the dopant gas. The residue L may be removed by an etching gas supplied through the first gas supply line 230a from the first gas supply source 220a. When the first process gas is controlled to have a relatively high temperature, the residue L may be effectively removed even by a relatively small amount of the first process gas.

Figure 7E:
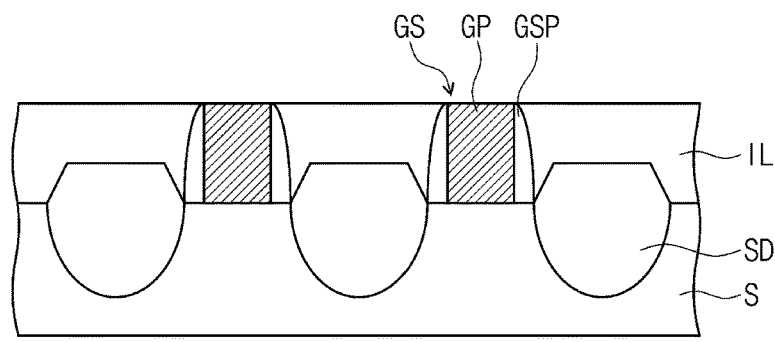

Referring to FIG. 7E, a gate structure GS may be formed. The gate structure GS may include a gate electrode GP. In more detail, an interlayer dielectric layer IL may be formed on the sacrificial gate structures SGS and the source/drain regions SD, and then the sacrificial gate patterns SGP may be removed to form cavities each of which is filled with the gate electrode GP. The interlayer dielectric layer IL may include one or more of a silicon oxide layer, a silicon nitride layer, a silicon oxynitride layer, and a low-k dielectric layer.

Figure 8:
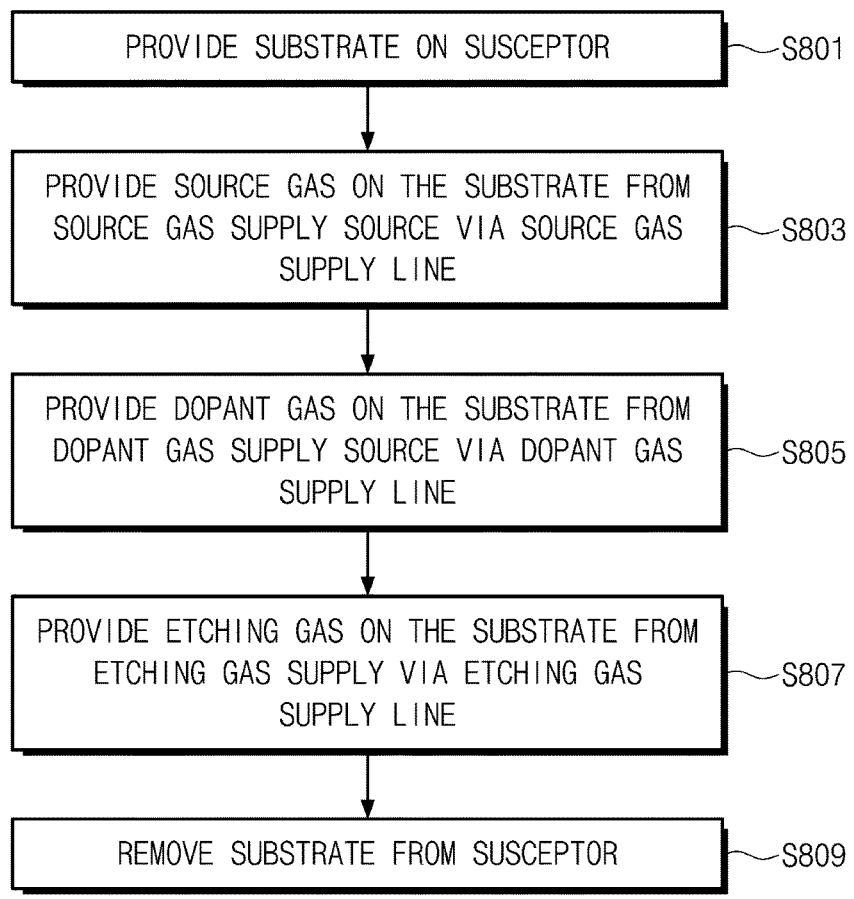
FIG. 8 is a flow chart showing a method of manufacturing a semiconductor device using a substrate treating apparatus according to exemplary embodiments of the present disclosure.

FIG. 8 is flow chart showing a method of manufacturing a semiconductor device using a substrate treating apparatus 1 according to exemplary embodiments of the present disclosure. The substrate treating apparatus 1 may include any one of the injector units 130a to 130d mentioned above.

In step S801, a substrate, e.g., a wafer W may be placed on a susceptor 120. The wafer W may be placed on a top surface of the susceptor 120.

In step S803, a source gas may be provided on the wafer W from a source gas supply unit via a source gas supply line. The source gas supply unit may be the second gas supply source 220b and the source gas supply line may be the second gas supply line 230b connected to the second gas supply source 220b as disclosed herein according to exemplary embodiments. The source gas supply line may be provided with the second heating units 240b. The source gas may be a precursor gas and may be used to form insulating layers or conductive layers on the wafer W. The source gas may be several gases having different compositions. Step S803 may be performed at several different instances during the semiconductor manufacturing and the source gas used may be different for different iterations of step S803 (e.g., a first source gas to form an insulator and a second source gas used to form a conductor, such an epitaxially grown crystalline semiconductor).

In step S805, a dopant gas may be provided on the wafer W from a dopant gas supply unit via a dopant gas supply line. The dopant gas supply unit may be the third gas supply source 220c and the dopant gas supply line may be the third gas supply line 230c connected to the third gas supply source 220c as disclosed herein according to exemplary embodiments. The dopant gas may be supplied at the same time the source gas is supplied (e.g., steps S803 and S805 may be concurrent) or may be supplied after a semiconductor material is formed by step S805 and be used to implant dopants into the semiconductor material via ionic bombardment of the semiconductor material.

In step S807, an etching gas may be provided on the wafer W from an etching gas supply unit via an etching gas supply line. The etching gas may selectively etch portions of the wafer W, such as insulating layers or conductive layers of the wafer W to provide patterned insulating layers or conductive layers in manufacturing integrated circuits within the wafer W. The etching gas supply unit may be the first gas supply source 220a and the etching gas supply line may be the first gas supply line 230a connected to the first gas supply source 220a as disclosed herein according to exemplary embodiments. The etching gas supply line may be provided with the first heating units 240a. According to exemplary embodiments, the first heating units 240a disposed on the etching gas supply line may have a first density per unit length of the etching gas supply line (and provide a first heat flux density to the first gas supply line 230a) and the second heating units 240b disposed on the source gas supply line may have a second density per unit length (and provide a second heat flux density to the second gas supply line 230b) of the source gas supply line. According to exemplary embodiments, the first density per unit length of the etching gas supply line is greater than the second density per unit length of the source gas supply line. Additionally, the first heat flux density may be greater than the second heat flux density.

Steps S803, S805 and S807 may be performed in other sequences other than that shown in FIG. 8 and may be repeatedly performed to form various patterned layers of a semiconductor integrated circuit chip. In step S809, the wafer W may be removed from the susceptor 120. Semiconductor chips (having integrated circuits formed therein) may be cut from the wafer W and form elements of semiconductor device packages.

According to embodiments of the present disclosure, there may be provided a substrate treating apparatus capable of selective temperature control based on process conditions and/or characteristics of the process gases. In particular, on the basis of a desired process object (e.g., achievement of high selectivity or high unit per equipment hour (UPEH)), the process gases may be selected and adjusted in their temperature.

The effects of the present disclosure are not limited to the aforementioned effects. Other effects, which are not mentioned above, will be apparently understood by one skilled in the art from the foregoing description and accompanying drawings.

These embodiments herein are presented to facilitate understanding of the present disclosure and should not limit the scope of the present disclosure, and it is intended that the present disclosure covers the various combinations, the modifications, and variations. The technical protection scope of the present disclosure will be defined by the technical spirit of the appended claims, and is intended to include all modifications and equivalent substantially falling within the spirit and scope of the invention while not being limited by literary descriptions in the appended claims.

What is claimed is:

1. A substrate treating apparatus comprising:
  a wafer chuck configured to receive a substrate;
  an injector unit disposed on a side of the wafer chuck, the injector unit is configured to inject process gases that include a first gas and a second gas; and
  a gas supply unit that supplies the process gases to the injector unit,
  wherein the gas supply unit comprises:
  a first gas supply source configured to accommodate the first gas and a second gas supply source configured to accommodate the second gas;
  a first gas supply line connecting the first gas supply source to the injector unit and a second gas supply line connecting the second gas supply source to the injector unit; and
  first heating units disposed on the first gas supply line and second heating units disposed on the second gas supply line,
  wherein the first heating units disposed on the first gas supply line have a first density per unit length of the first gas supply line and the second heating units disposed on the second gas supply line have a second density per unit length of the second gas supply line,
  wherein the first density per unit length of the first gas supply line is greater than the second density per unit length of the second gas supply line, and
  wherein the gas supply unit further comprises:
  a third gas supply source; and a third gas supply line that connects the third gas supply source to the injector unit,
wherein no heating unit is provided on the third gas supply line.

2. The apparatus of claim 1, wherein the injector unit comprises:
a first spray hole through which the first gas is sprayed; and
a second spray hole through which the second gas is sprayed,
wherein the first and second gas supply lines are respectively connected to the first and second spray holes.

3. The apparatus of claim 2, wherein the first spray hole has a cross-sectional area smaller than the cross-sectional area of the second spray hole.

4. The apparatus of claim 1, further comprising a process chamber in which a process is performed, wherein
the wafer chuck is installed within the process chamber,
the injector unit is disposed on a first sidewall of the process chamber, and
the gas supply unit is disposed outside the process chamber.

5. The apparatus of claim 4, wherein the injector unit comprises:
an injector coupled to the first sidewall of the process chamber; and
an injector baffle coupled to the injector, the injector baffle spraying the process gases into the process chamber.

6. The apparatus of claim 5, wherein the injector baffle includes a first end portion coupled to the injector which is coupled to the first sidewall of the process chamber and a second end portion opposite the first end portion of the injector baffle extending away from the first sidewall of the process chamber in a direction horizontal to a top surface of the wafer chuck such that the second end portion of the injector baffle is further away from the first sidewall of the process chamber compared to the first end portion of the injector baffle.

7. The apparatus of claim 5, wherein the injector baffle comprises spray holes through which the process gases are sprayed into the process chamber.

8. The apparatus of claim 7, further comprising a mixing zone being disposed within the injector and mixing the first and second gases supplied from the first and second gas supply lines.

9. The apparatus of claim 8, wherein the mixing zone has an end portion connected to the first and second gas supply lines and another end portion connected to the spray holes.

10. The apparatus of claim 8, further comprising a third heating unit disposed within the injector and surrounding the mixing zone.

11. The apparatus of claim 4, further comprising an exhaust unit being disposed at a second sidewall of the process chamber opposite the first sidewall of the process chamber and facing the injector unit,
wherein the process gases are exhausted outside of the process chamber through the exhaust unit.

12. The apparatus of claim 1, further comprising a pre-heating ring disposed on outside perimeter of the wafer chuck to surround the wafer chuck.

13. A substrate treating apparatus comprising:
a wafer chuck configured to receive a substrate;
an injector unit disposed on a side of the wafer chuck, the injector unit is configured to inject process gases that include a first gas and a second gas; and
a gas supply unit that supplies the process gases to the injector unit,
wherein the gas supply unit comprises:
a first gas supply source configured to accommodate the first gas and a second gas supply source configured to accommodate the second gas;
a first gas supply line connecting the first gas supply source to the injector unit and a second gas supply line connecting the second gas supply source to the injector unit; and
first heating units disposed on the first gas supply line and second heating units disposed on the second gas supply line,
wherein the first heating units disposed on the first gas supply line have a first density per unit length of the first gas supply line and the second heating units disposed on the second gas supply line have a second density per unit length of the second gas supply line,
wherein the first density per unit length of the first gas supply line is greater than the second density per unit length of the second gas supply line, and
wherein the first and second gas supply sources are each provided in plural.

14. The apparatus of claim 1, wherein the first and second heating units include a heating coil or a heating jacket.

15. The apparatus of claim 1, wherein the wafer chuck is rotatable.

16. A method of manufacturing a semiconductor device comprising:
placing a substrate on a top surface of a wafer chuck;
supplying a source gas on the substrate from a source gas supply unit via a source gas supply line, the source gas supply line having a plurality of first heating units configured to heat the source gas, the plurality of first heating units having a first density per unit length of the source gas supply line; and
supplying an etching gas on the substrate from an etching gas supply unit via an etching gas supply line, the etching gas supply line having a plurality of second heating units configured to heat the etching gas, the plurality of second heating units having a second density per unit length of the etching gas supply line,
wherein the second density per unit length of the etching gas supply line is greater than the first density per unit length of the source gas supply line.

17. The method according to claim 16, further comprising supplying a dopant gas on the substrate from a dopant gas supply unit via a dopant gas supply line before supplying the etching gas on the substrate.

18. The method according to claim 16, further comprising removing the substrate from the wafer chuck after supplying the etching gas on the substrate.

19. The method according to claim 16, further comprising: providing a pre-heating ring on outside perimeter of the wafer chuck to surround the wafer chuck.

* * * * *